(12) United States Patent
Schmidt et al.

(10) Patent No.: US 11,451,911 B2
(45) Date of Patent: Sep. 20, 2022

(54) HEARING DEVICE AND METHOD OF MANUFACTURING THE SAME

(71) Applicant: Sonova AG, Stafa (CH)

(72) Inventors: Mark Schmidt, Breslau (CA); Gabriel Perez, Maennedorf (CH); John Whitmore, Heidelberg (CA); Dave Ma, Kitchener (CA); Munsoo Bae, Waterloo (CA)

(73) Assignee: SONOVA AG, Stäfa (CH)

( * ) Notice: Subject to any disclaimer, the term of this patent is extended or adjusted under 35 U.S.C. 154(b) by 102 days.

(21) Appl. No.: 16/989,985

(22) Filed: Aug. 11, 2020

(65) Prior Publication Data

US 2021/0051427 A1 Feb. 18, 2021

(30) Foreign Application Priority Data

Aug. 16, 2019 (EP) ..................................... 19192113

(51) Int. Cl.
*H04R 25/00* (2006.01)
*H05K 1/18* (2006.01)

(52) U.S. Cl.
CPC ......... *H04R 25/652* (2013.01); *H04R 25/554* (2013.01); *H04R 25/658* (2013.01); *H04R 2225/025* (2013.01); *H04R 2225/51* (2013.01); *H05K 1/189* (2013.01)

(58) Field of Classification Search
CPC .............. H04R 2225/51; H04R 25/554; H04R 2225/025; H04R 25/658
See application file for complete search history.

(56) References Cited

U.S. PATENT DOCUMENTS

| 8,494,197 | B2 | 7/2013 | Polinske et al. |
| 2017/0150278 | A1 | 5/2017 | Ruaro |
| 2018/0084351 | A1* | 3/2018 | Polinske ............. H04R 25/554 |
| 2019/0069101 | A1 | 2/2019 | Kvist |
| 2019/0116431 | A1 | 4/2019 | Hesselballe et al. |
| 2019/0141460 | A1 | 5/2019 | Hasani |
| 2019/0320271 | A1 | 10/2019 | Hesselballe et al. |

FOREIGN PATENT DOCUMENTS

| EP | 2200119 A2 | 6/2010 |
| EP | 2285138 B1 | 4/2013 |
| EP | 2680366 A1 | 1/2014 |
| EP | 2688314 A2 | 1/2014 |

(Continued)

OTHER PUBLICATIONS

Search Report issued in European Patent Application No. 19 192 113 dated Feb. 26, 2020.

*Primary Examiner* — Phylesha Dabney
(74) *Attorney, Agent, or Firm* — Pearne & Gordon LLP

(57) ABSTRACT

A hearing device including a shell to be worn at least in part in the ear canal and having an outer opening; a faceplate covering the outer opening of the shell and facing outwardly of the ear canal when the hearing device is worn in the ear canal; a transceiver configured to operate in an operating frequency range which is located within 2.4 GHz to 2.5 GHz; and a dipole antenna. The dipole antenna is integrated within the faceplate or at an outer surface of the faceplate in a manner so as to follow the contour of the outer surface of the faceplate to maximize radiation gain of the dipole antenna.

19 Claims, 4 Drawing Sheets

(56) References Cited

FOREIGN PATENT DOCUMENTS

| EP | 2986030 | A1 | 2/2016 |
| EP | 3110174 | A1 | 12/2016 |
| EP | 3110175 | A1 | 12/2016 |
| EP | 3174314 | A1 | 5/2017 |
| EP | 3471200 | A1 | 4/2019 |
| WO | 2017153020 | A1 | 9/2017 |

* cited by examiner

HEARING DEVICE AND METHOD OF MANUFACTURING THE SAME

The invention relates to a hearing device to be worn at least partially in the ear canal and comprising an antenna and to a method of manufacturing such hearing instrument.

BACKGROUND

Hearing devices which are to be worn at least partially in the ear canal comprise a shell with an outwardly facing opening which is covered by a faceplate. ITE ("in-the-ear") hearing devices are examples of such hearing devices. The shell may have a standard shape or may be customized (having a shape corresponding to the individual shape of the ear canal of the user), wherein the housing/shell has an outer opening which is covered by a faceplate which faces outwardly of the ear canal when the ITE hearing instrument is worn in the ear canal.

For wireless applications, in particular in the 2.4 GHz ISM (Industrial, Scientific, and Medical) band, ITE hearing instruments may be provided with a suitable antenna. The antenna design is determined by the available limited space, the desired frequency band and the interference of the electromagnetic radiation with the tissue of the user.

U.S. Pat. No. 8,494,197 B2 relates to an ITE hearing aid wherein one loop of a double loop antenna surrounding the battery and the electronic unit is inserted into a groove in the inwardly facing (interior) surface of the faceplate; the antenna comprises conductive traces on a flexible dielectric layer.

WO 2017/153020 A1 relates to an ITE hearing aid with an antenna with an open ring structure provided at the interior surface of the faceplate as a stamped-out metal foil glued onto the interior surface of the faceplate.

EP 2 285 138 B1 relates to an ITE hearing aid wherein a loop antenna or patch antenna is integrated or embedded within the battery door or battery lid. Similar ITE hearing aids are known from EP 3 110 174 A1 and EP 3 110 175 A1, wherein in addition to loop antennas and patch antennas also partial loop antennas, slot antennas an inverted F-antennas are mentioned.

EP 2 680 366 A1 relates to an ITE hearing aid wherein a slot antenna is provided at the outer surface of the faceplate.

US 2019/0069101 A1 relates to an ITE hearing aid with an antenna comprising a curved first section located in the faceplate, a curved second section which mirrors the first section and is located below the faceplate and a linear third section connecting one end of the first section and one end of the second section, wherein each of the other end of the first and second section is connected to a feed point by a linear section.

US 2017/0150278 A1 relates to an ITE hearing aid, wherein a magnetic loop antenna is arranged in the faceplate or is attached to the faceplate.

BRIEF SUMMARY

It is an object of the invention to provide for a hearing device with an antenna which is suitable for efficient operation in the 2.4 to 2.5 GHz ISM band. It is a further object to provide for a method of manufacturing such hearing instrument.

According to the invention, these objects are achieved by a hearing device and a manufacturing method as defined in the claims.

The invention is beneficial in that it allows for efficient operation in the 2.4 to 2.5 GHz ISM band, since the antenna is a dipole antenna which is integrated within the faceplate or at the outer surface of the faceplate in a manner so as to follow the contour of the outer surface of the faceplate, whereby radiation gain may be maximized.

Preferred embodiments of the invention are defined in the dependent claims.

BRIEF DESCRIPTION OF THE DRAWINGS

Hereinafter, examples of the invention will be illustrated by reference to the attached drawings, wherein.

DETAILED DESCRIPTION

As used hereinafter, "hearing devices" include all kinds of hearing devices which are configured to be worn at least partially in the ear canal, such as ITE hearing devices, ITC (in-the-canal) hearing devices or CIC (completely-in-the-canal) hearing devices.

As used hereinafter, "outwardly"/"outer" relates to a direction away from the tympanic membrane, when the hearing device is worn at least partially in the ear canal, and "inwardly"/"inner" relates to a direction towards the tympanic membrane, when the hearing device is worn at least partially in the ear canal.

The invention relates to hearing devices to be worn at least partially in the ear canal, in particular ITE hearing instruments, comprising a housing/shell be worn at least in part in the ear canal and having an outer opening which is covered by a faceplate. The ear canal further comprises a transceiver configured to operate in an operating frequency range which is located within 2.4 GHz to 2.5 GHz (which is an ISM band), and a dipole antenna connected to the transceiver. The dipole antenna is integrated within the faceplate or at the outer surface of the faceplate in a manner so as to follow the contour of the outer surface of the faceplate to maximize radiation gain (the outer opening faces outwardly of the ear canal when the hearing instrument is worn in the ear canal).

In some implementations, the dipole antenna is folded around a battery and an electronic subassembly of the hearing device. The dipole antenna may have two arms with an end gap between the arms, wherein the end gap preferably is from 0.1 to 5 mm so as to control performance of the antenna.

Figure 1A:
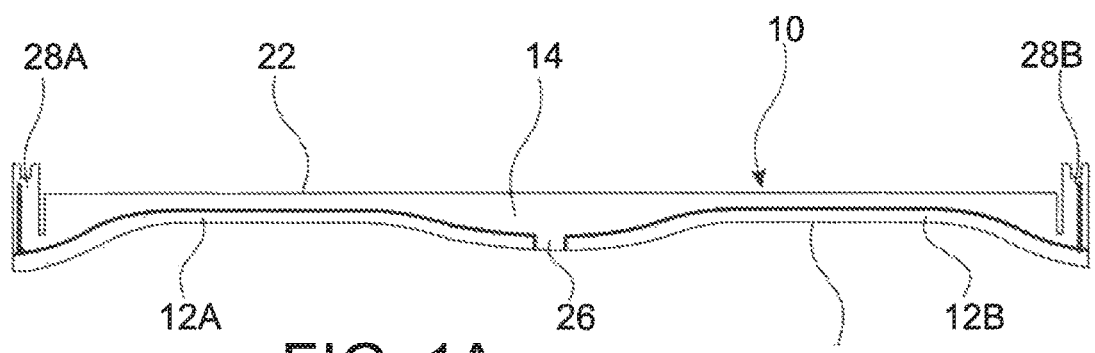
FIGS. 1A to 1D are perspective views of a first example of an antenna in an unfolded state, the antenna in a folded state, a faceplate and the antenna and electrical components of an ITE hearing instrument when mounted at the faceplate, respectively.
Figure 1B:
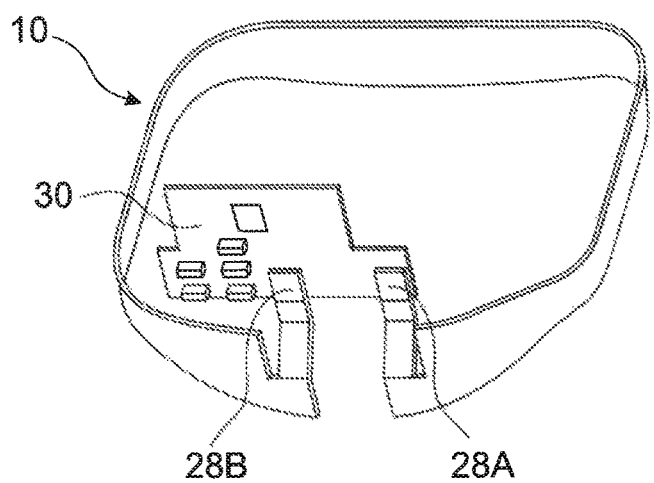

In FIGS. 1A to 1D a first example of an implementation of the dipole antenna is shown, wherein the dipole antenna 10 is implemented as a conductor trace 12 on a flexible PCB (Printed Circuit Board) 14 which is placed internally in the faceplate 16 within a trench 18 formed in the inner (inwardly facing) surface 20 of the faceplate. FIG. 1A is a side view of the antenna 10 in its unfolded state, and FIG. 1B is a perspective view of the antenna in its folded state prior to insertion into the trench 18.

It can be seen in FIG. 1A that the flexible PCB 14 has an outer edge 24 (which faces outwardly of the ear canal when the hearing device is worn in the ear canal) and an inner edge 22 (which faces inwardly when the hearing device is worn in the ear canal), with the conductive trace 12 extending along the outer edge 24. The conductive trace 12 may have a width of from 0.1 mm to 1 mm. The inner edge 22 of the PCB 14 is substantially flat (planar), while the outer edge 24 with the conductive trace 12 has a curved shape which corresponds to the contour of the outer surface of the faceplate 16. In particular, the curved shape of the outer edge 24 is complementary to the contour of the outer surface of the faceplate 16 which, in turn, defines the contour of the bottom of the trench 18.

Thus, once inserted into the trench 18, the conductive trace 12 is located in a maximal outwardly facing position of the faceplate so as to maximize radiation gain (the tissue surrounding the ear canal interferes to some extent with the electromagnetic radiation, so that an outwardly oriented position of the antenna increases radiation gain).

The conductive trace 12 of the antenna 10 includes a first arm 12A and a second arm 12B which are separated by an end gap 26 which preferably is from 0.1 to 5 mm. Appropriate selection of the width of the end gap 26 allows to optimize performance of the antenna 10.

While the end gap 26 is located in a central portion of the PCB 14, each of the ends of the PCB 14 comprises an antenna feed point 28A and 28B, respectively. According to FIGS. 1A and 1B, the feed point 28A and 28B are connected to a matching board 30 which contains impedance matching components. The matching board 30 may be attached to the PCB 14 of the antenna 10, or it may be provided separate.

The width of the PCB 14 is such that the inner edge 22 is substantially flush with the inner surface 20 of the faceplate 16 when the PCB 14 is fully inserted within the trench 18. Thus, the planar shape of the inner edge 22 of the PCB 14 allows to recognize correct positioning of the PCB 14 in the trench 18 when the inner edge 22 is flush with the inner surface 20 of the faceplate 16.

The trench 18 is provided as deep as possible so as to allow positioning of the conductive trace 12 of the antenna 10 as close as possible to the outer surface of the faceplate, so as to maximize radiation gain. The trench 18 is substantially orthogonal to the inner surface 20 of the faceplate 16 so as to minimize physical space required for the antenna 10.

According to one embodiment, the PCB 14 of the antenna 10 may be fixed in the trench 18 by a mechanical locking system, for example, a snap-in mechanism. The trench 18 should be as narrow as possible so as to provide for a defined position of the antenna 10 after assembly. To improve fitting and positioning of the flexible PCB 14 in the trench 18 additional dielectric material may be added to the trench or the flexible PCB 14; such additional electric material also may be used for antenna tuning.

Figures 1C, 1D:
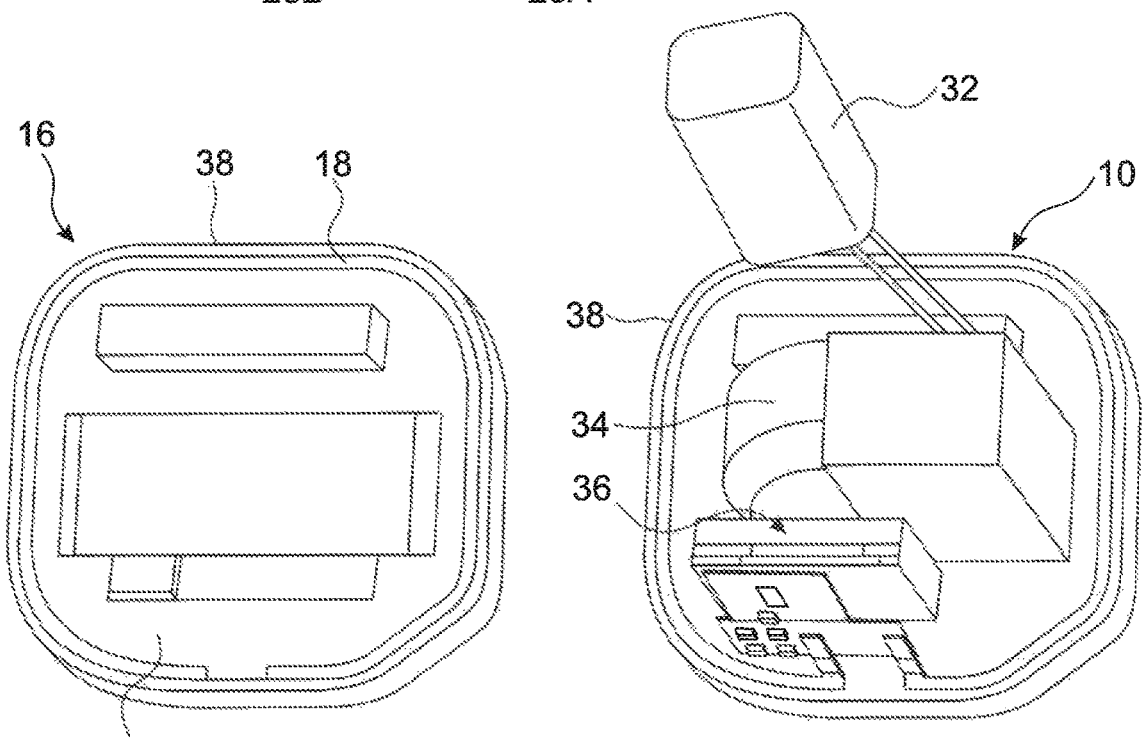

The state of the faceplate 16 after assembly is shown in FIG. 1D, with the PCB 14 being inserted into the trench 18, with some internal components of the hearing device being likewise shown in FIG. 1D, namely a loudspeaker 32, a battery 34 and an electronic subassembly 36.

As can be seen in FIGS. 10 and 1D, the trench 18 extends close to the edge 38 of the faceplate 16 almost along the entire length of the circumference of the faceplate 16, so that the antenna 10 is folded around or surrounds the battery 34 and the electronic subassembly 36 which are mounted at the inner surface 20 of the faceplate 16.

Figure 2A:
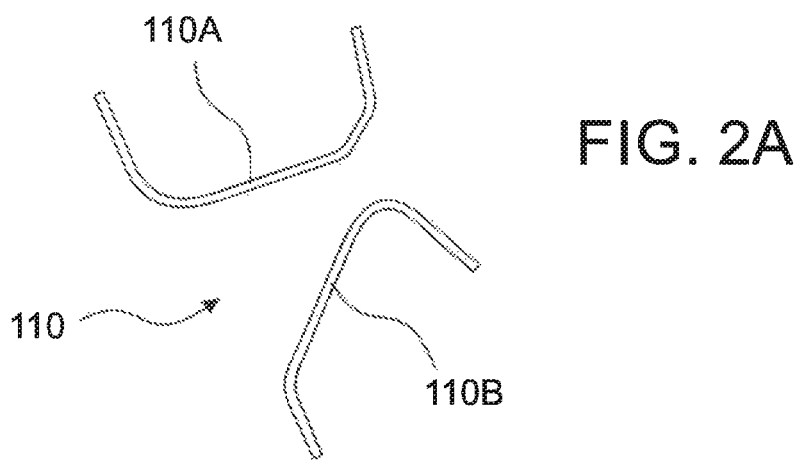
FIGS. 2A to 2C are perspective views of a second example of a dipole antenna prior to assembly and two variants of a faceplate with the mounted antenna, respectively.
Figure 2B:
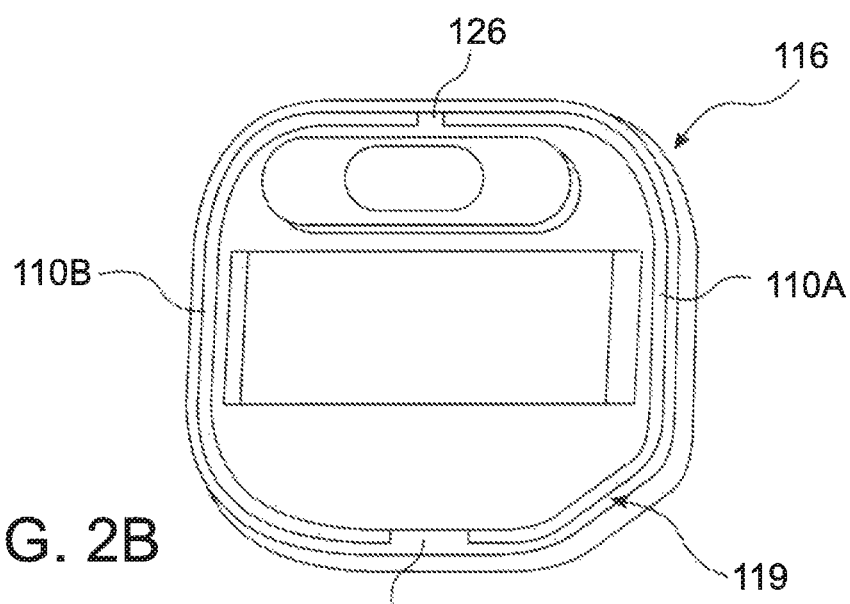
Figure 2C:
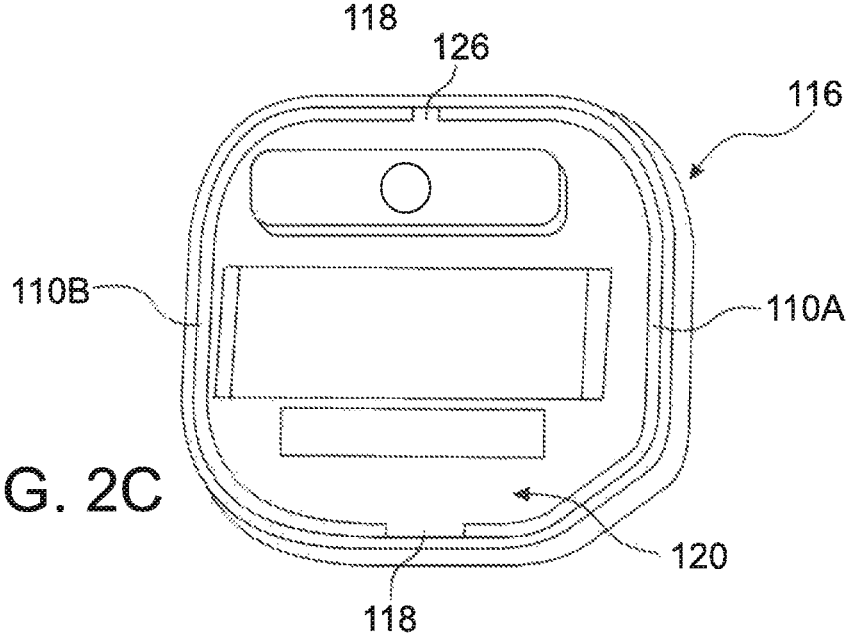

FIGS. 2A to 2C show a second example of a faceplate with an integrated dipole antenna, wherein the dipole antenna is implemented as a preformed wire 110 comprising two separate parts 110A and 110B which are to be inserted within a channel of the faceplate 116. The channel may be a trench 118 which is formed in the outer surface 119 (see example shown in FIG. 2B) or in the inner surface 120 (see example shown in FIG. 2C). The two wire parts 110A, 110B form the two arms of the antenna 110, with an end gap 126 being provided between the respective ends of the arms/wire parts 110A, 110B. As in the example of FIGS. 1A to 1D the end gap 126 preferably is from 0.1 to 5 mm. The other end of each wire part 110A, 110B may be connected with an impedance matching board or circuitry (not shown in FIGS. 2A to 2C). The selection of the width of the end gap 126 is helpful for antenna tuning. The width of the end gap 126 may be controlled by appropriate design of the trench 118.

In case that the antenna trench 118 is provided at the inner surface 120 of the faceplate 116, the trench should be as deep as possible to maximize radiation gain.

Preforming of the antenna wire parts 110A, 110B aids in the insertion of the wire parts 110A, 110B into the (relatively narrow) trench 118.

In some implementations, the trench 118 may be back-filled with the electric material to secure the antenna wire parts 110A, 110B in place in the trench 118. The permittivity of the backfill material may be selected for antenna tuning purposes (the backfill material may be selected accordingly).

As in the example of FIGS. 1A to 1D, the antenna trench 118 surrounds the battery and an electronic subassembly of the hearing device, with the trench extending along and close to the circumference of the faceplate.

Figure 3:
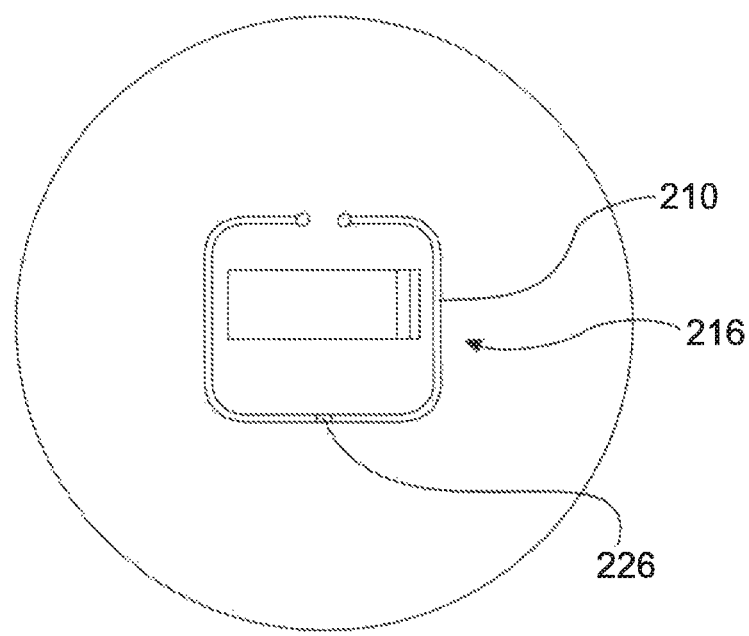
FIG. 3 is an elevated view of a third example of a faceplate with an integrated dipole antenna.

Another example of a faceplate with an integrated antenna is shown in FIG. 3, wherein the antenna 210 is implemented using an LDS ("Laser Direct Structuring") or LMA ("Laser Manufactured Antenna") technology, wherein the antenna may be printed, for example, as an LDS or LMA antenna pattern on the outer surface or the inner surface of the faceplate. As in the previous examples, the antenna is a dipole antenna with two arms separated by an end gap 226 of, for example, from 0.1 to 5 mm, with the antenna surrounding the battery and the electronic subassembly.

Figure 4:
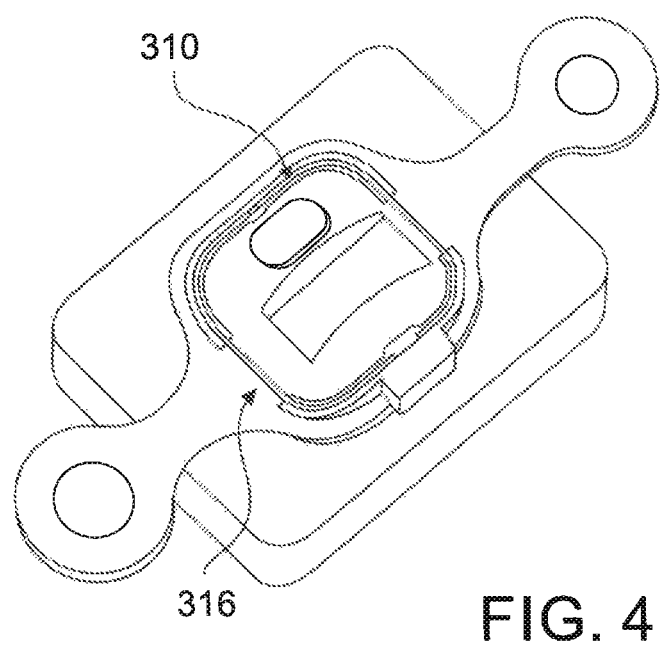
FIG. 4 is an elevated view of fourth example of a faceplate with an integrated antenna during assembly.

A further example of a faceplate with an integrated antenna is illustrated in FIG. 4, wherein the dipole antenna is implemented as a preformed antenna element 310 which is embedded within the faceplate 316. In some implementations, the antenna element 310 is a stamped metal structure which follows the contour of the outer surface of the faceplate 316 to maximize radiation gain of the antenna 310. As in the previous examples, the antenna is a dipole antenna with two arms separated by an end gap which surround the battery and the electronic subassembly. The stamped metal structure 310 may be embedded within the faceplate 316 by a two-stage molding process. Preferably, the stamped metal structure 310 is located as close as possible to the outer surface of the faceplate so as to maximize radiation gain.

Figure 5A:
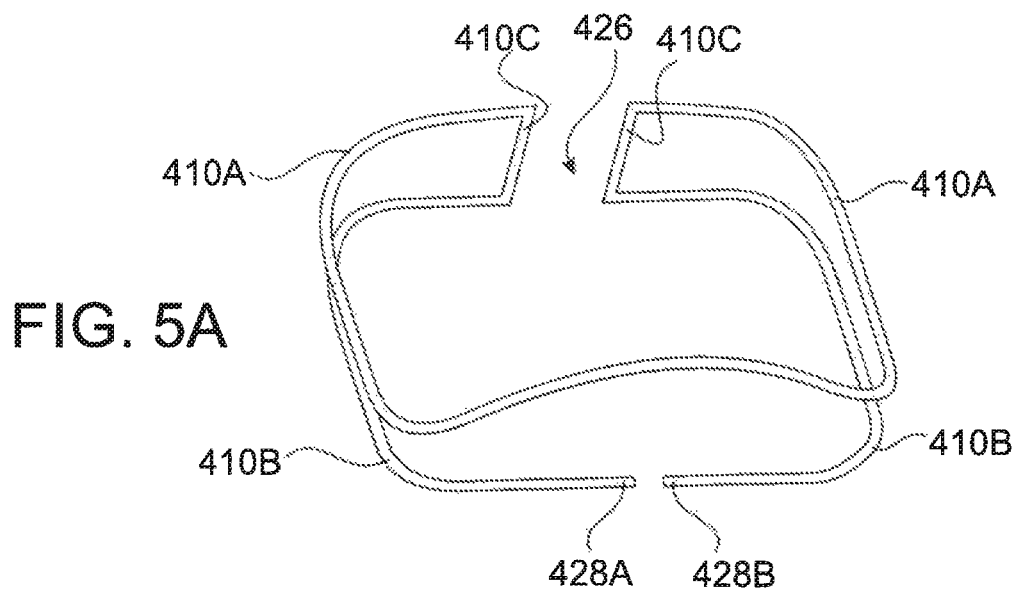
FIGS. 5A to 5C are a perspective view of a fifth example of a dipole antenna prior to assembly, a side view of a faceplate with the antenna after assembly and an elevated view of the faceplate, respectively.
Figure 5B:
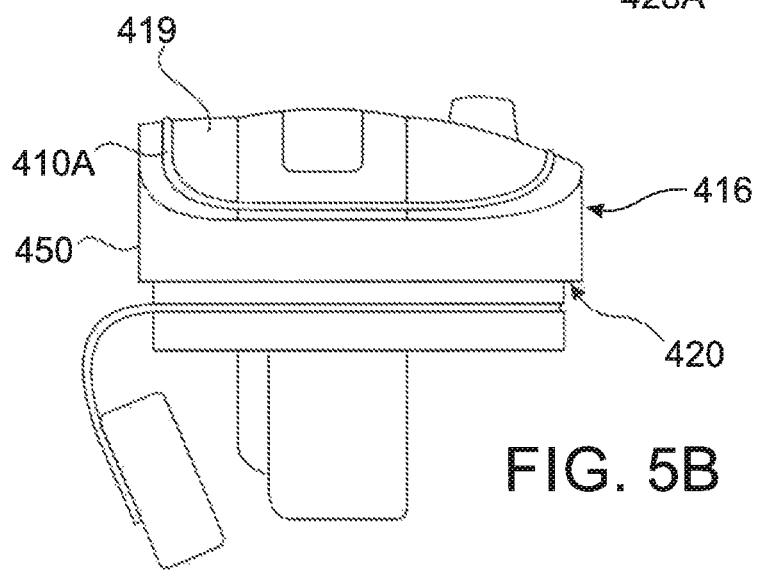
Figure 5C:
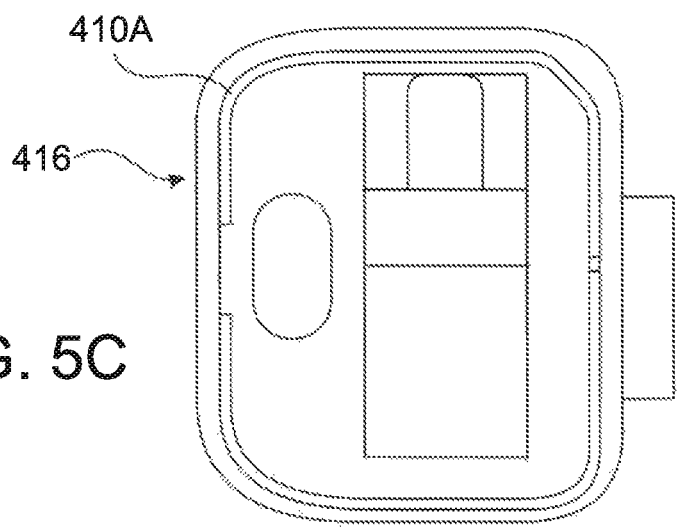

A still further example of a faceplate with an integrated dipole antenna is illustrated in FIGS. 5A to 5C, wherein the dipole antenna 410 comprises radiating sections extending on both the outer surface of the faceplate and the inner surface of the faceplate, spaced apart by the thickness of the faceplate. In the example illustrated in FIGS. 5A to 5C, the antenna 410 comprises an outer section 410A, an inner section 410B and a connection section 410C which connects the outer section 410A and the inner section 410B. The outer section 410A and the inner section 410B are essentially parallel to each other, spaced apart by the thickness of the faceplate 416, and both surround the battery and the electronic subassembly of the hearing device. The outer section 410A and the inner section 410B both extend along the circumference of the faceplate 416 and are located close to the peripheral boundary surface 450 of the faceplate 416. The outer section 410A is curved so as to follow the contour of the outer surface 419 of the faceplate 416. The inner section 410B includes the antenna feed points 428A and 428B.

The connection section 410C consists of two parallel linear portions, each providing for a connection between the outer section 410A and the inner section 410B, with the end gap 426 being formed between the two portions of the connection section 410C The antenna 410 may be implemented as a preformed wire which is inserted into respective trenches formed in the outer surface 419 and the inner surface 420 of the faceplate 416.

The invention claimed is:

1. A hearing device, comprising:
    a shell to be worn at least in part in the ear canal and having an outer opening;
    a faceplate covering the outer opening of the shell and facing outwardly of the ear canal when the hearing device is worn in the ear canal;
    a transceiver configured to operate in an operating frequency range which is located within 2.4 GHz to 2.5 GHz;
    a dipole antenna;
    wherein the dipole antenna is integrated within the faceplate or at an outer surface of the faceplate in a manner so as to follow the contour of the outer surface of the faceplate to maximize radiation gain of the dipole antenna and the dipole antenna has two arms with an end gap between the ends of the arms, and
    wherein the end gap is from 0.1 to 5 mm so as to control performance of the dipole antenna.

2. The hearing device of claim 1, wherein the dipole antenna surrounds a battery and an electronics subassembly of the hearing device.

3. The hearing device of claim 1, wherein the dipole antenna comprises radiating sections extending on both the outer and inner surfaces of the faceplate, spaced apart by the thickness of the faceplate.

4. The hearing device of claim 1, wherein the dipole antenna is implemented as a flexible PCB placed internally in the faceplate within a trench on the inner surface of the faceplate.

5. The hearing device of claim 4, wherein the flexible PCB is mechanically locked within the trench by a snap-in mechanism.

6. The hearing device of claim 4, wherein an edge of the flexible PCB is flush with the inner surface of the faceplate when the flexible PCB is fully inserted within the trench.

7. The hearing device of claim 4, wherein the dipole antenna comprises a conductor trace located at the outer edge of the flexible PCB.

8. The hearing device of claim 1, wherein the dipole antenna is implemented as a preformed wire placed internally or externally within a channel of the faceplate.

9. The hearing device of claim 8, wherein the preformed wire is inserted into a trench in the outer surface or into a trench in the inner surface of the faceplate, the trench forming the channel.

10. The hearing device of claim 4, wherein the trench is backfilled with dielectric material.

11. The hearing device of claim 1, wherein the dipole antenna is implemented using an LDS ("laser direct structuring") or LMA ("laser manufactured antenna") technology.

12. The hearing device of claim 11, wherein the dipole antenna is printed as an LDS/LMA antenna pattern on the outer and/or inner surface of the faceplate.

13. The hearing device of claim 1, wherein the dipole antenna is implemented as a preformed antenna element embedded within the faceplate.

14. The hearing device of claim 13, wherein the antenna element is a stamped metal structure.

15. The hearing device of claim 13, wherein the antenna element is embedded by a two-stage molding process.

16. A method of manufacturing a hearing device, comprising the steps of:
    providing for a shell to be worn at least in part in the ear canal and having an outer opening;
    providing for a faceplate for covering the outer opening of the shell and facing outwardly of the ear canal when the hearing device is worn in the ear canal;
    providing a transceiver configured to operate in an operating frequency range which is located within 2.4 GHz to 2.5 GHz;
    providing a dipole antenna with two arms with an end gap between the ends of the arms wherein the end gap is from 0.1 mm to 5 mm; and
    integrating the dipole antenna within the faceplate or at an outer surface of the faceplate in a manner so as to follow the contour of the outer surface of the faceplate to maximize radiation gain of the dipole antenna.

17. A hearing device, comprising:
    a shell to be worn at least in part in the ear canal and having an outer opening;
    a faceplate covering the outer opening of the shell and facing outwardly of the ear canal when the hearing device is worn in the ear canal;
    a transceiver configured to operate in an operating frequency range which is located within 2.4 GHz to 2.5 GHz;
    a dipole antenna;
    wherein the dipole antenna is integrated within the faceplate or at an outer surface of the faceplate in a manner so as to follow the contour of the outer surface of the faceplate to maximize radiation gain of the dipole antenna,
    wherein the dipole antenna is implemented using an LDS ("laser direct structuring") or LMA ("laser manufactured antenna") technology.

18. A method of manufacturing a hearing device, comprising the steps of:
    providing for a shell to be worn at least in part in the ear canal and having an outer opening;
    providing for a faceplate for covering the outer opening of the shell and facing outwardly of the ear canal when the hearing device is worn in the ear canal;
    providing a transceiver configured to operate in an operating frequency range which is located within 2.4 GHz to 2.5 GHz;
    providing a dipole; and
    integrating the dipole antenna within the faceplate or at a surface of the faceplate in a manner so as to follow the contour of the surface of the faceplate to maximize radiation gain of the dipole antenna, wherein the dipole antenna is implemented using an LDS ("laser direct structuring") or LMA ("laser manufactured antenna") technology.

19. The hearing device of claim 18, wherein the dipole antenna is printed as an LDS/LMA antenna pattern on an outer and/or inner surface of the faceplate.

\* \* \* \* \*

UNITED STATES PATENT AND TRADEMARK OFFICE
CERTIFICATE OF CORRECTION

| | |
|---|---|
| PATENT NO. | : 11,451,911 B2 |
| APPLICATION NO. | : 16/989985 |
| DATED | : September 20, 2022 |
| INVENTOR(S) | : Mark Schmidt et al. |

It is certified that error appears in the above-identified patent and that said Letters Patent is hereby corrected as shown below:

In the Specification

In Column 3, Line 66, please replace "FIGS. 10 and 1D, the trench" with --FIGS. 1C and 1D, the trench--

Signed and Sealed this
Twenty-first Day of May, 2024

Katherine Kelly Vidal
*Director of the United States Patent and Trademark Office*